United States Patent
Leung et al.

(10) Patent No.: US 7,301,488 B2
(45) Date of Patent: Nov. 27, 2007

(54) DIGITAL PWM CONTROLLER FOR PREVENTING LIMIT CYCLE OSCILLATIONS

(75) Inventors: Ka Y. Leung, Austin, TX (US); Jinwen Xiao, Austin, TX (US)

(73) Assignee: Silicon Laboratories Inc., Austin, TX (US)

(*) Notice: Subject to any disclaimer, the term of this patent is extended or adjusted under 35 U.S.C. 154(b) by 71 days.

(21) Appl. No.: 11/095,193

(22) Filed: Mar. 31, 2005

(65) Prior Publication Data
US 2006/0227860 A1 Oct. 12, 2006

(51) Int. Cl.
*H03M 1/20* (2006.01)
(52) U.S. Cl. ............... 341/131; 341/152; 323/223; 323/282; 323/283
(58) Field of Classification Search ............... 341/131
See application file for complete search history.

(56) References Cited

U.S. PATENT DOCUMENTS

| 4,630,187 | A | | 12/1986 | Henze |
| 4,988,942 | A | * | 1/1991 | Ekstrand ............... 323/282 |
| 5,594,324 | A | * | 1/1997 | Canter et al. ............ 323/282 |
| 6,812,681 | B1 | * | 11/2004 | Hong et al. ............ 323/283 |
| 6,989,661 | B2 | * | 1/2006 | Chapuis ............ 323/283 |
| 7,002,327 | B2 | * | 2/2006 | Marino et al. ............ 323/283 |
| 2004/0095122 | A1 | | 5/2004 | Chapuis |
| 2004/0155637 | A1 | | 8/2004 | Chapuis |
| 2004/0196014 | A1 | | 10/2004 | Chapuis |
| 2005/0285584 | A1 | * | 12/2005 | Kwan ............ 323/283 |

OTHER PUBLICATIONS

Aleksandar Prodic, et al.; Mixed-Signal Simulation of Digitally Controlled Switching Converters: Colorado Power Electronics Center, Department of Electrical and Computer Engineering, University of Colorado at Boulder; Boulder, CO 80309-0425, USA, unknown date.
Patella, B.J. et al.; High-Frequency Digital PWM Controller IC for DC-DC Converters; Power Electronics, IEEE, vol. 18, Issue 1; pp. 438-446; Jan. 2003.
Albert M. Wu, et al.; Digital PWM Control: Application in Voltage Regulation Modules; Department of Electrrical Engineering and Computer Sciences, University of California, Berkeley; IEEE 1999.
F. Baronti, et al.; DC/DC Switching Power Converter with Radiation Hardened Digital Control Based on SRAM FPGAs; P/MAPLD 2004.
Angel V. Peterchev, et al.; Quantization Resolution and Limit Cycling in Digitally Controlled PWM Converters; Department of Electrical Engineering and Computer Science, University of California, Berkeley; unknown date.

(Continued)

*Primary Examiner*—Khai M. Nguyen
(74) *Attorney, Agent, or Firm*—Howison & Arnott, L.L.P.

(57) ABSTRACT

An apparatus and method for minimizing limit cycle oscillations within a switched power supply includes providing a programmable dither signal as an input to the digital control loop connected between an output and a control input of the switched power supply. The dither signal minimizes limit cycle oscillations from the output of the switched power supply.

25 Claims, 5 Drawing Sheets

OTHER PUBLICATIONS

Biranchinath Sahu, et al.: Adaptive Power Management of Linear RF Power Amplifiers in Mobile Handsets: An Integrated System Design Approach; Georgia Tech Analog and Power IC Design Laboratory, School of Electrical and Computer Engineering, Georgia Institute of Technology; Submission for IEEE Asia Pacific 2004.

Aleksandar Prodic, et al.; Design of a Digital PID Regulator Based on Look-Up Tables for Control of High-Frequency DC-DC Converters; Colorado Power Electronics Center, Department of Electrixcal and Computer Engineering, University of Colorado; Boulder, CO 80309; 0425, USA, unknown date.

John Sustersic, et al.; Design and Implementation of a Digital Controller for DC-to-DC Power Converters; NASA Clen Research Center, Robert Button; The Advanced Engineering Research Laboratory, Cleveland State University. Copyright 2000 Society of Automotive Engineers, Inc.

Gu-Yeon Wei, et al.; A Fully Digital, Energy-Efficient, Adaptive Power-Supply Regulator; IEEE Journal of Solid State Circuits, vol. 34, No. 4, Apr. 1999.

Dragan Maksimovic, et al.; Custom IC Blocks for Enabling Digital Control in Switching Power Converters; Colorado Power Electronics Center, University of Colorado, Boulder, Jul. 11, 2003.

LM2636 5-Bit Programmable Synchronous Buck Regulator Controller, National Semiconductor, Mar. 2005; 2005 National Semiconductor Corporation.

Jinwen Xiao, et al.; An Ultra-Low-Power Digitally-Controlled Buck Converter IC for Cellular Phone Applications; University of California, Berkeley; IEEE 2004.

Jinwen Xiao, et al.; Architecture and IC Implementation of a Digital VRM Controller, Department of Electrical Engineering and Computer Science, University of California, Berkeley; IEEE 2001.

* cited by examiner

DIGITAL PWM CONTROLLER FOR PREVENTING LIMIT CYCLE OSCILLATIONS

CROSS-REFERENCE TO RELATED APPLICATIONS

This application is related to co-pending U.S. patent application Ser. No. 11/096,597, filed of even date herewith, and entitled "Digital PWM Controller," which is incorporated herein by reference in its entirety; co-pending U.S. patent application Ser. No. 11/096,598, filed of even date herewith, now U.S. Pat. No. 7,245,512, issued Jul. 17, 2007, and entitled "PID Based Controller for DC-DC Converter with Post-Processing Filters," which is incorporated herein by reference in its entirety; and co-pending U.S. patent application Ser. No. 11/096,853, filed of even date herewith, and entitled "Digital Power Supply Controller with Voltage Positioning," which is incorporated herein by reference in its entirety.

TECHNICAL FIELD OF THE INVENTION

The present invention relates to digital control loops of a switched power supply, and more particularly, to controlling limit cycle oscillations caused within a digital control loop of a switched power supply.

BACKGROUND OF THE INVENTION

Analog control provides very fine resolution for output voltage adjustments for switched power supplies. In principle, a voltage can be adjusted to any arbitrary value limited by loop gain, thermal effects and system noise level. On the other hand, a digital control loop has a finite set of discrete "set points" resulting from the resolution of quantizing elements in the system. In a digital control loop of a power supply, two such elements comprise an analog to digital converter and a digital pulse width modulator. Resolution is defined as the number of states that can be uniquely represented by the control word involved. An "n" bit control word can assume $2^n$ states since each bit has two values.

When a power switching stage is modulated by a pulse stream containing $2^n$ possible pulse widths, after averaging by the filter stage, the number of discrete output values equals $2^n$. Output voltage resolution corresponds to the space between voltage levels. One or more discrete output voltage levels must correspond to the desired output voltage "set point" of the power module including a tolerance. If the resolution in a downstream quantizing element is less than the resolution in the upstream quantizing element, the upstream quantizing element will be unable to find an output voltage that lies within a specific value level for the downstream quantizing element. Thus, one upstream quantizing element LSB change will cause a downstream element to move the output voltage by more than one LSB equivalent. As a result, the system will appear to hunt for a stable value and will bounce up and down around the desired value. This phenomena is called limit cycle oscillation. The limit cycle oscillations occur in a periodic manner which would create an additional tone in the output of the switched power supply. This is undesirable to power supply designs. Thus, there is a need for providing an individual with means for controlling limit cycle oscillations, and in the event limit cycle oscillations are occurring some means for limiting the effects of the periodic nature of the limit cycle oscillations.

SUMMARY OF THE INVENTION

The present invention disclosed and claimed herein, in one aspect thereof, comprises an apparatus and method for minimizing limit cycle oscillations within a switched power supply including a digital control loop. The switched power supply includes an input, an output and a control input. The digital control loop is connected between the output and the control input, and a dither signal is provided as an input to the control loop. The dither signal minimizes limit cycle oscillations from the output of the switched power supply.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
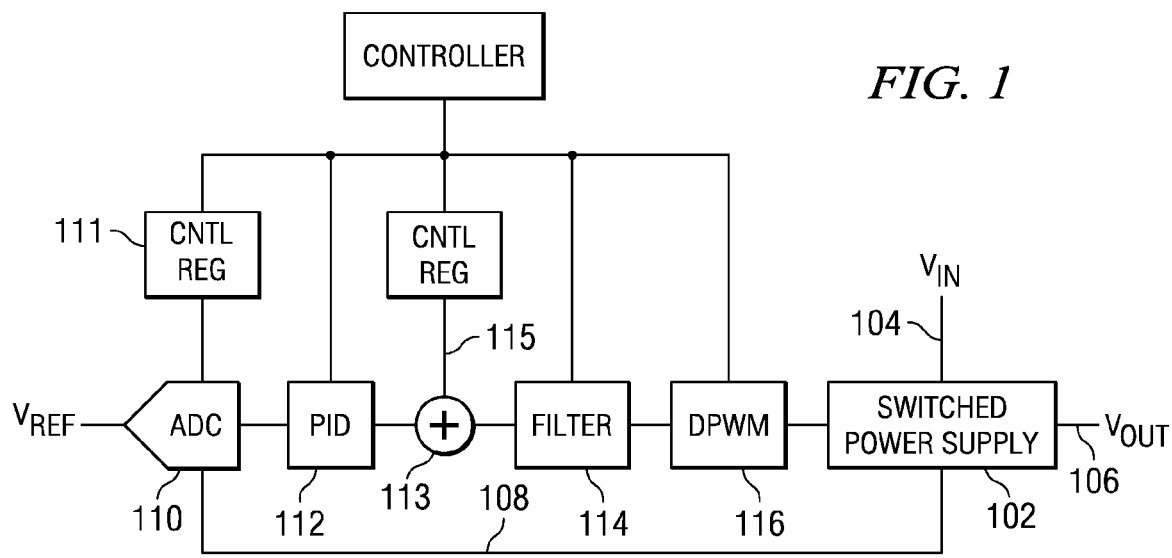
FIG. 1 is a functional block diagram of a switched power supply including a digital feedback loop.

Referring now to the drawings, and more particularly to FIG. 1, there is illustrated a block diagram of a switched power supply including a digital feedback loop. The switched power supply 102 has an input port 104 for receiving an input voltage $V_{IN}$ and an output port 106 for providing an output voltage $V_{OUT}$. A digital control loop is provided for the switched power supply 102 between the output port 106 and a control input 108. The digital control loop consists of an analog to digital converter (ADC) 110 for converting the analog output voltage signal $V_{OUT}$ into a digital signal. The ADC 110 additionally includes a control input for providing control values for the ADC 110. One of these control values, provided from a control register 111 of the ADC 110, includes control values enabling the programmability of the LSB of the ADC 110. The ADC 110, responsive to this controlled LSB, provides an output having a defined resolution. Connected to the output of the ADC 110 is a proportional integral derivative engine (PID) 112.

The PID 112 has its output connected to a filter 114. Also connected to the output of the PID 112 is an adding circuit 113 enabling a dither signal to be added to the output of the PID 112. The dither signal is provided via an input 115 from a control register accessed by a controller 118. The particular dither values applied to the adding circuit 113 are programmable by the user via the controller 118. The output of the filter 114 is provided to the input of the digital pulse width modulator (DPWM) 116. The output of the DPWM 116 is provided to the power supply 102 via control input 108 to control switches of the power supply 102. While the DPWM 116 in FIG. 1 is illustrated as having a single input to the power supply, in practice, the DPWM 116 of the present disclosure provides six phase outputs to the switching transistors of the power supply 102. The operation of the DPWM 116, filter 114, PID 112 and ADC 110 are each controlled by a controller 118 and associated control registers. The controller 118 provides control values to the control registers for each of the described devices in accordance with provided source code to the controller 118.

Figure 2:
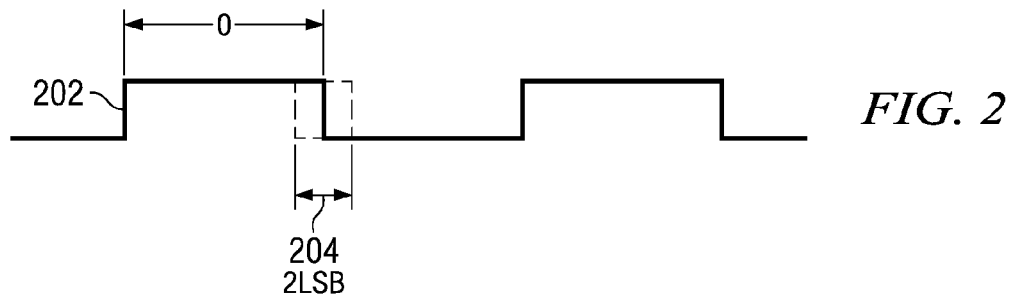
FIG. 2 illustrates the duty cycle of the pulsed output of the DPWM and two LSBs associated with the pulse width of the DPWM.

Referring now to FIG. 2, there is illustrated a digital output of the DPWM 116 consisting of a pulse 202 having a duty cycle D associated therewith. This pulse 202 could be associated with either of the ADC 110 or the DPWM 116. The LSB 204 associated with the pulse 202 is the resolution of the discrete values which are used to represent particular voltage levels for the ADC 110 and the DPWM 116. For the DPWM 116 the value of the LSB 204 is fixed and may not be changed depending upon which power supply 102 has been connected to the associated digital control loop. However, in order to compensate for different power supplies 102 connected to the digital control loop, the LSB 204 of the ADC 110 may be programmed using control inputs applied to control input 111. The difference between the LSB resolutions of the ADC 110 and the DPWM 116 is responsible for the limit cycle oscillations that may occur.

Figure 3A:
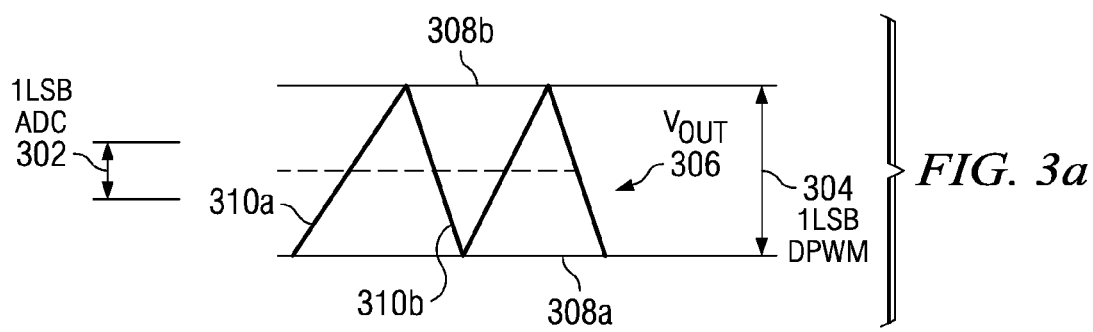
FIGS. 3a-3b illustrate the effects of the limit cycle oscillations with respect to analog to digital converters and digital pulse width modulators having differing resolutions.
Figure 3B:
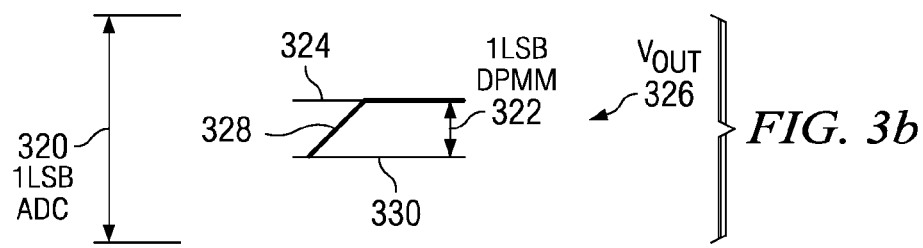

Referring now to FIGS. 3a through 3c, there is illustrated the various effects on limit cycle oscillations due to differing resolutions of the LSB between the ADC 110 and the DPWM 116. In FIG. 3a there is illustrated a situation wherein the resolution 302 of the LSB of the analog to digital converter 110 is greater than the resolution 304 of the DPWM 116. The output voltage 306 to which the DPWM 116 is trying to be tuned is between two voltage levels 308 and 310 represented by the LSB 304 of the DPWM 116. When the ADC 110 changes its LSB 302 by one, the output 310 of the DPWM 116 will oscillate from the first discrete voltage level 308a to the second discrete voltage level 308b in an attempt to reach the desired output voltage $V_{OUT}$ 306. However, when the output 310 overshoots the desired output voltage 306, the ADC 116 will attempt to decrease the voltage by one LSB 302, and the output 310 will go from voltage level 308b to voltage level 308a as shown by output segment 310b. This process will continue as the output 310 of the DPWM 116 attempts to reach the output voltage level 306 that resides between the two discrete voltage levels which may be reached based upon the resolution of the DPWM 116. This creates the limit cycle oscillations represented by the output 310 resembling a periodic triangular wave form. This circumstance is caused by the fact that the resolution of the DPWM 116 prevents the discrete voltage levels 308a and 308b at which the DPWM 116 may provide an output voltage from corresponding to the output voltage goal of $V_{OUT}$ 306.

Referring now to FIG. 3b, there is illustrated a situation wherein the resolution 320 of the LSB of the analog to digital converter 110 is less than the resolution 322 of the LSB of the digital pulse width modulator 118. In this case, since the resolution of the LSB of the DPWM 118 is much greater (by at least one bit), output voltage level 324 corresponds to the desired output voltage $V_{OUT}$ 326 of the DPWM 118. When the LSB of the ADC 110 is increased by one, the LSB of the DPWM 116 is changed by one such that the output 328 of the DPWM goes from voltage level 330 to voltage level 324. When this happens, the output voltage $V_{OUT}$ 326 of the DPWM 118 is consistent with the desired value and there are no further limit cycle oscillations.

Referring now back to FIG. 1, in order to minimize or limit the limit cycle oscillations at the output of the DPWM 116 and the power supply 102, it is important that the resolution of the DPWM 116 be greater than the resolution of the ADC 110. Since the resolution of the DPWM 116 is fixed and may not be changed, this requires the LSB resolution of the ADC 110 to be programmable. This is achieved via the control input 111 described herein above. Control values may be stored in a control register associated with the analog to digital converter 110. These control values select a resolution for the ADC 110 that either minimizes or eliminates the limit cycle oscillations caused at the output of the DPWM 116 and the power supply 102. This is achieved by the controller 118 providing control values that assure the resolution of the ADC is less than the resolution of the DPWM 116. These values may be selected based upon the operating parameters of a switched power supply 102 which is connected to the digital control loop including the ADC 110 and DPWM 116.

In addition to minimizing or eliminating the limit cycle oscillations by controlling the resolution of the analog to digital converter 110, the effects of limit cycle oscillations may be limited by making the oscillations appear to be noise. This is useful in the case the resolution of the ADC is greater than the resolution of the DPWM. A major problem with limit cycle oscillations is the fact that they appear as a periodic signal as the DPWM 116 output oscillates between the two discrete voltage levels in an attempt to lock into the desired output voltage. By inserting a dithering signal into the digital control loop, the effects of the limit cycle oscillations may be made to appear as random noise within the signal rather than as a periodic signal. Dithering varies the duty cycle by an LSB over a number of switching periods so that the average duty cycle has a value between two adjacent quantized duty cycle levels. The use of a dithering signal is more fully illustrated in FIG. 4.

Figure 4:
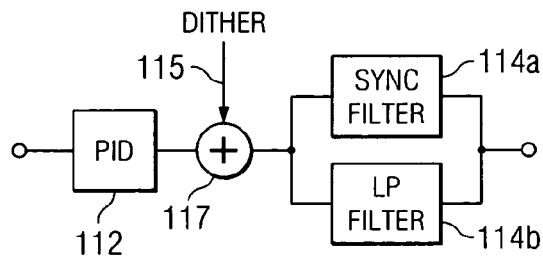
FIG. 4 illustrates the inclusion of a dither signal into the digital control loop at the output of the PID.

FIG. 4 illustrates the portion of the digital control loop between the input of the PID 112 and the output of the filter 114. The output of the PID 112 is connected to an adding circuit 117 having a first input connected to the output of the PID 112 and a second input 115 connected to receive the dither signal from a control register. The dither signal is provided from the controller 118 to the control register 111 and is programmable by the user during system configuration. The amount of dither introduced into the digital control loop may be determined in such a manner to determine the minimum amount of dither noise that will minimize or eliminate the limit cycle oscillations in an optimal manner. The output of the adding circuitry 117 is provided to the input of the filter 114. FIG. 4 more fully illustrates that the filter 114 consists of a selectable configuration of a sinc filter 114a and a low pass 114b. In any particular application the filter is programmed such that only the sinc filter 114a or low pass filter 114b are used. The output of the selected filter 114 is provided to the input of the DPWM 116 as described herein above.

The dither signal introduced at the output of the PID 112 will cause the limit cycle oscillations to no longer occur in the periodic pattern discussed with respect to FIG. 3. The limit cycle oscillations will appear as random noise at the output of the switched power supply 102 and thus not introduce an additional tone into the output. By introducing the dither signal at the output of the PID 112, the signal will not appear as additional noise at the output of the DPWM 116 and the switched power supply 102. If the dither signal were introduced at the input of the PID 112, the noise would ride up on top of the limit cycle oscillations rather than limiting the limit cycle oscillations. By introducing the dither at the output of the PID, the noise due to the infinite gain at DC of the PID 112 will not cause the introduced dither signal to appear as additional noise at DC at the switched power supply 102 output only as random noise.

Figure 5:
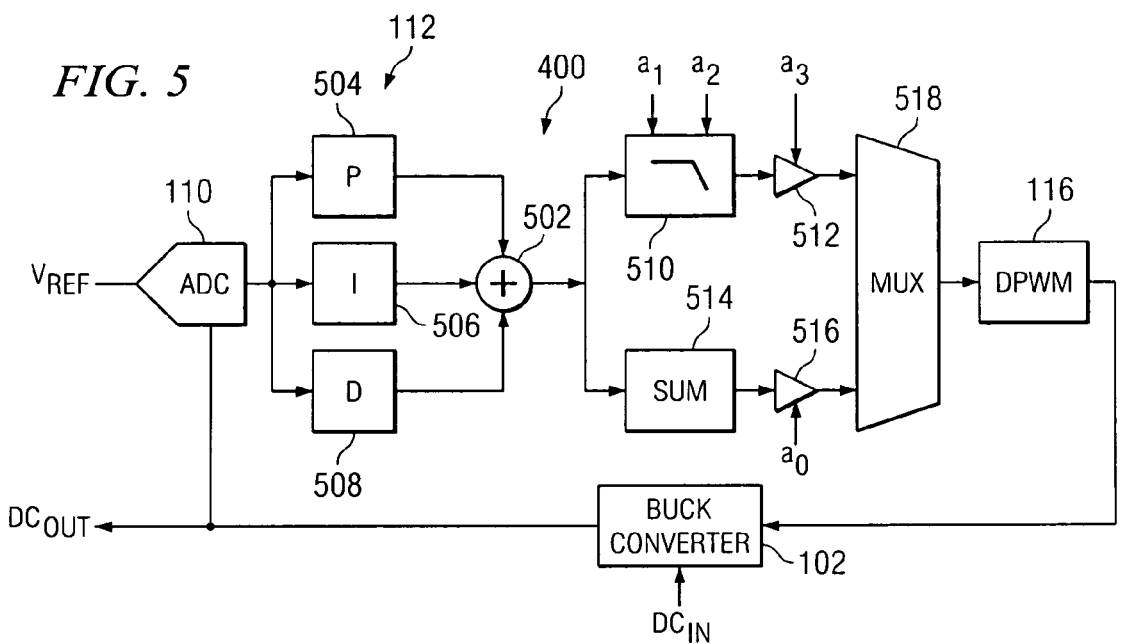
FIG. 5 illustrates a simplified block diagram of the PID.

Referring now to FIG. 5, there is illustrated a simplified diagrammatic view of the digital controller and the digital compensator 500. The PID block 112 is comprised of three paths that are summed with a summing junction 502. The first path provides a proportional relationship with a block 504, the second path provides an integration function with an integration block 506 and the third block provides a differentiation path with a block 508. As noted hereinabove, this is referred as a PID controller. The proportional block 504 has a steady state proportional gain, $K_p$, and provides some phase lag. The integral path and integration block 506 has an integral gain, $K_i$, which is generally set to "0" and reduces the steady state error. There is some phase lag associated with this. The differential path associated with the differentiation block 508 has a derivative gain, $K_d$, which provides some phase lead by anticipating future operations. Thus, the overall PID block 112 provides phase compensation for the overall control loop.

The output of the summing junction 502 is input to, as described hereinabove, either a low pass filter 114b or a sinc filter 114a. The low pass filter 114b is comprised of a block 510 that has associated therewith a low pass filter frequency response with two poles. This is passed through an amplification stage 512 with another coefficient associated with the amplification, this being the coefficient that is controlled by the microcontroller 118. Thus, there are three coefficients, $a_1$, $a_2$ and $a_3$ that control the operation of the low pass filter function, these being the coefficients of the low pass filter. The sinc filter 114a is basically comprised of a summing block or an accumulation block 514, which is operable to sum over a range of delay values, this being a decimation type sinc filter. A gain factor is provided by an amplification stage 516 which has a coefficient $a_0$ associated therewith. This $a_0$ will set the position of the sinc filter notch, as will be described hereinbelow. A multiplexer 518 is operable to select between the output of amplification stage 512 and the amplification stage 516 for input to the DPWM 406.

Figure 6:
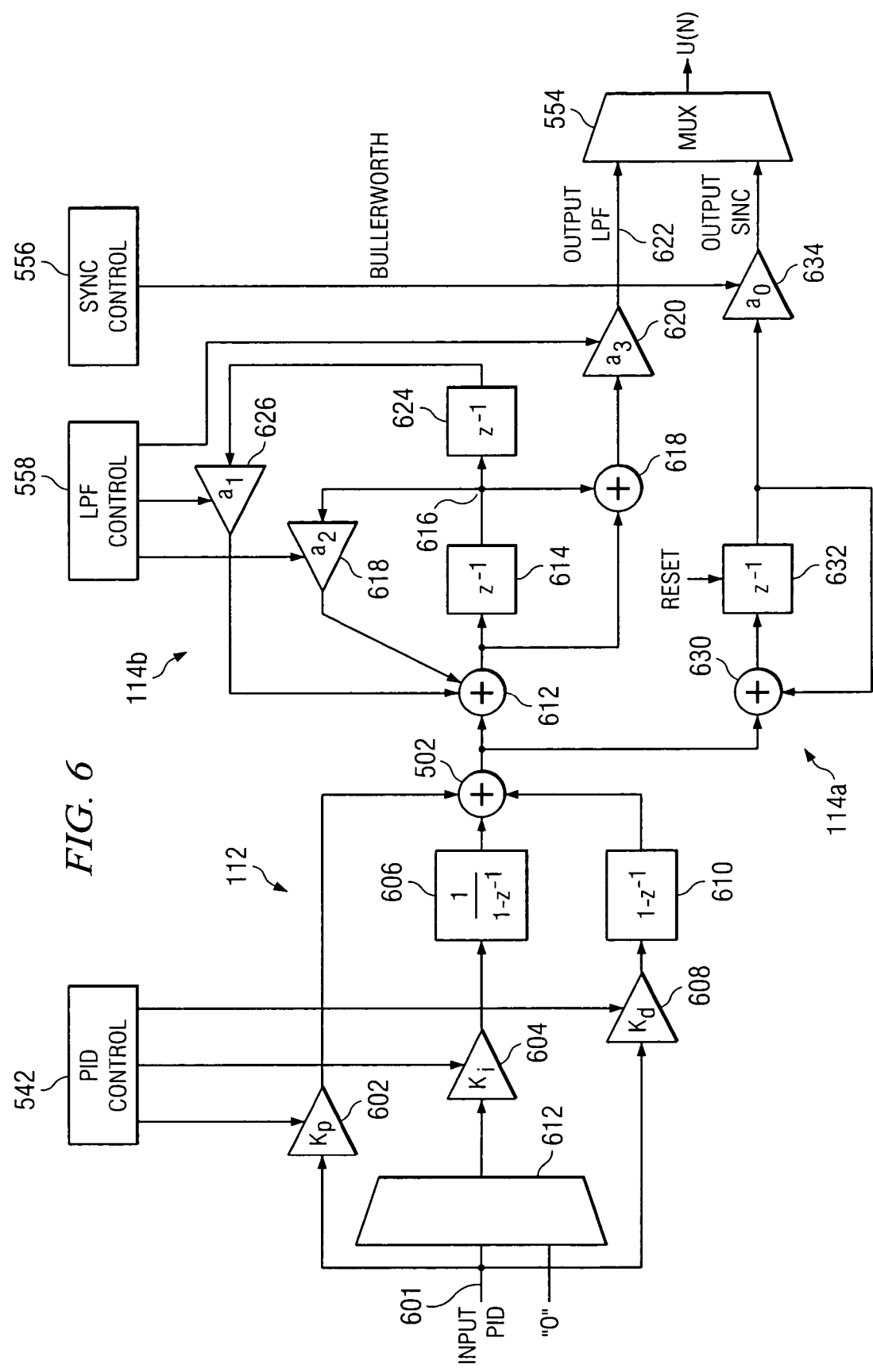
FIG. 6 illustrates a more detailed block diagram of the PID.

Referring now to FIG. 6, there is illustrated a more detailed block diagram of the PID 112 and the low pass filter 114b and the sinc filter 114a. The proportional path of the block 504 has a gain stage 602 associated therewith with the gain factor $K_p$. This is controlled by the PID control block 542. The integral block has a gain block 604 associated therewith with the integral gain factor $K_i$. The output of this is passed through a transfer function $1/(1-z^{-1})$ in a block 606. The output of this block is input to the summing junction 502. The integration path and the block 508 are comprised of a gain block 608 with a differential gain $K_d$. The output of this gain block 608 is input to a delay block 610 to provide the delay $(1-z^{-1})$. The output of block 610 is input to the summing junction 502. Additionally, there is provided a multiplexer 612 having one input thereof connected to the input 601 and the other input connected to a digital word with a value of "0." The output of the multiplexer 612 is input to the input of the gain block 604. In that error condition, the "0" value can be selected such that the integration path is on hold. This will be described in more detail hereinbelow.

The low pass filter is configured with an input summing junction 612, the output thereof connected to a delay block 614 with a delay of $z^{-1}$. The output of delay block 614 is connected to a node 616, which node 616 has a signal associated therewith fed back through a coefficient block 618 with a coefficient $a_2$, the output thereof input to the summing block 612. Node 616 is also input to one input of a summing junction 618, the output thereof connected to the input of a coefficient block 620, the output thereof providing the output of the low pass filter on a node 622. The input to delay block 614 is also input to summing junction 612. Node 616 is input through a delay block 624 with a delay $z^{-1}$, the output thereof input through a coefficient block 626 with a coefficient $a_1$ to another input of the summing junction 612. The low pass filter control block 558 sets the coefficients $a_1$, $a_2$ and $a_3$. In general, this is a Butterworth configuration low pass filter, a fairly conventional digital filter.

The sinc filter is comprised of an input summing junction 630, the output thereof input through a delay block 632 with a delay of $z^{-1}$, the output thereof input to a coefficient block 634, the output thereof providing the output of the sinc filter 114a, coefficient block 634 having the coefficient $a_0$ associated therewith, this coefficient provided by the sinc control block 556. The output of delay block 632 is also fed back to the input of summing junction 630 to provide the accumulation operation. This delay block 632 has a reset input associated therewith which is reset at a predetermined time. As noted hereinabove, this is a decimation type sinc filter. The output of both the low pass filter and the sinc filter are input to respective inputs of the multiplexer 554. This provides the u(n) error signal. The low pass filter or the sinc filter can be selected, depending upon the particular application and the desire of the applications engineer.

Figure 7A:
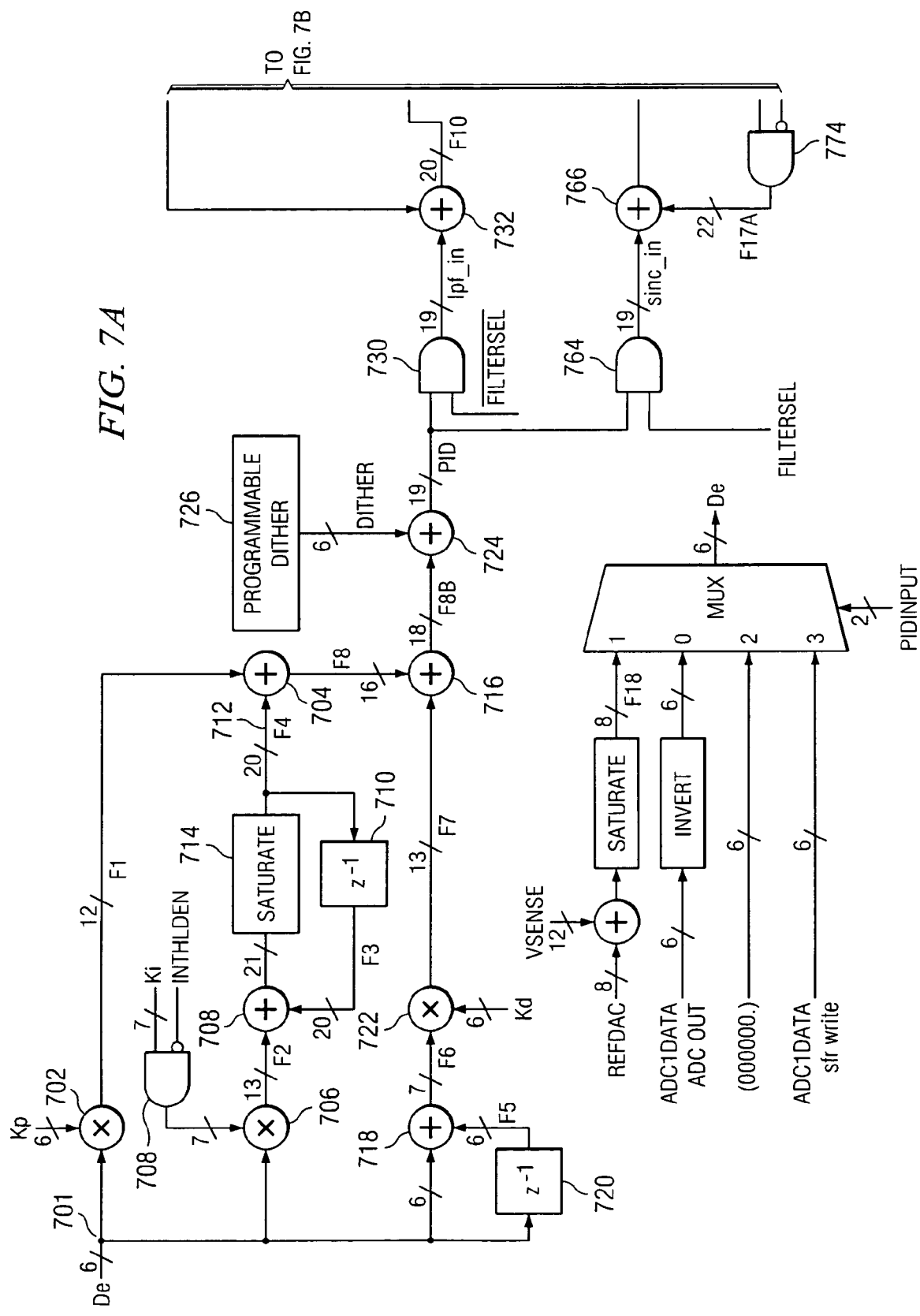
FIG. 7 illustrates a block diagram of one implementation of the PID.
Figure 7B:
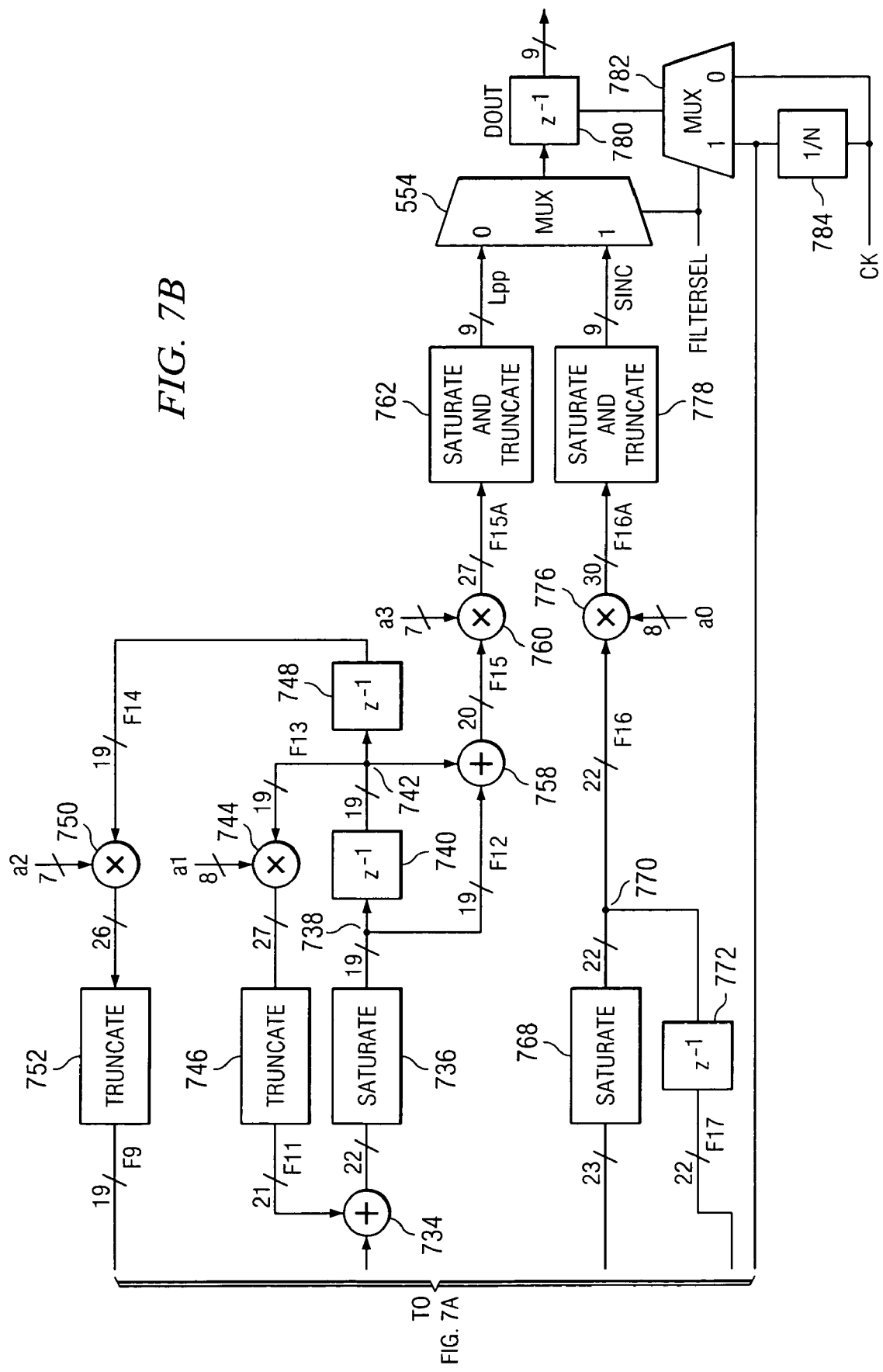

Referring now to FIG. 7, there is illustrated a more detailed implementational diagram of the digital compensator 500. The input 601 of the PID is input along three paths, as noted hereinabove. The proportional path utilizes a multiplier 702 having one input connected to the node 601 and the other input thereof for receiving the digital value of $K_p$ and providing on the output the result for input to a first summing junction 704. The integral path has a multiplier 706 associated therewith having one input thereof connected to the input 601 and the other input thereof for multiplication with the output of an AND gate 708. One input of the AND gate is connected through an inverter node to an integrate hold enable signal, INTHLDEN, and the other input thereof connected to the $K_i$ integral constant. The output of multiplier 706 is fed to the input of a summing junction 708 for summing with the output of a feedback delay block 710 which is operable to feedback the output from a node 712. The output of the summing junction 708 is passed through a saturation block 714 to a node 712. Node 712 is input to the other input of the summing junction 704. The output of summing junction 704 is input to a summing junction 716. The differentiator block has a summing node 718 for receiving on the one input thereof the value on the node 601 and on the other input thereof the value on node 601 delayed by delay block 720, this input to a negative input such that the block 718 is a difference block. The output of the difference block 718 is input to a multiplication block 722 for multiplication of the output of the summing block 718 with the constant case $K_d$. The output of multiplication block 722 is input to the summing block 716. The summing block 716 is input to a summing block 724, this operable to receive on the input thereof a programmable dither signal, generated by a programmable dither register 726. By changing the value of this programmable dither, the value output by the summing junction 716 can be varied.

The output of the summing junction 724 comprises the PID output. This is input to the two filters. The low pass filter is configured with an AND gate 730, one input connected to the PID output and the other input thereof connected to the filter select signal, FILTERSEL-EAR. The output of the enable gate 730 is input to a summing junction 732. The output of summing junction 732 is input to the input of a summing junction 734, the output thereof connected through a saturate block 736 to a node 738 for input to a delay block 740, the output thereof connected to a node 742. Node 742 is input to one input of a multiplication block 744, the other input thereof connected to the coefficient $a_1$ for multiplication therewith. The output of multiplication block 744 is passed through a truncation block 746 to truncate the value output therefrom for input to the other input of the summing junction 734 on a negative input thereof to provide a subtraction operation with the summing junction 734. The output of node 742 is also input through a delay block 748 to the input of a multiplication block 750 for multiplication with the $a_2$ coefficient. The output of multiplication block 750 is truncated with a truncation block 752 for input to a negative input on the summing junction 732 such that a subtraction operation is performed by the summing junction 732. A summing junction 758 is operable to the sum of the output of node 742 and the output of node 738, the output thereof input to a multiplication block 760 for multiplication with the $a_3$ coefficient. The output of multiplication block 760 is input to a block 762 for saturation of truncation and then to the input of the multiplexer 554.

The sinc filter is facilitated with an input selection AND gate 764 having one input connected to the PID output and the other input connected to the filter select signal, FILTERSEL. The output of the gate 764, the enable gate, is input to one input of a summing junction 766, the output thereof connected through a saturate block 768 to a node 770. Node 770 is connected through a delay block 772 to an input of an AND gate 774. The output of AND gate 774 is input to the other input of the summing junction 766. Node 770 is also input to a multiplication block 776 for multiplication with the sinc filter coefficient, $a_0$, the output thereof connected to a saturate and truncation block 778 for output to the other input of the multiplexer 554.

When the sinc filter is selected, a different clock signal is utilized for delaying the output. A delay 780 is provided on the output of the multiplexer 554. A multiplexer 782 selects the control signal for the delay 780 to adjust the delay thereof. This either can be the raw clock signal or the raw clock signal divided by a factor of "N," with a divide block 784. The clock signal is input to one input of the multiplexer 780 and to the other input thereof through the divide block 784 to provide the divide down clock signal. The divide down clock signal also provides the second input to the enable gate 774 through inverting node thereon. Thus, the divide ratio provides the "reset" for the accumulation operation, the accumulation operation operating at the filter clock rate. The divide down "N" ratio sets the number of accumulations that will be allowed to occur before the reset, at which time the data output will be provided.

Figure 8:
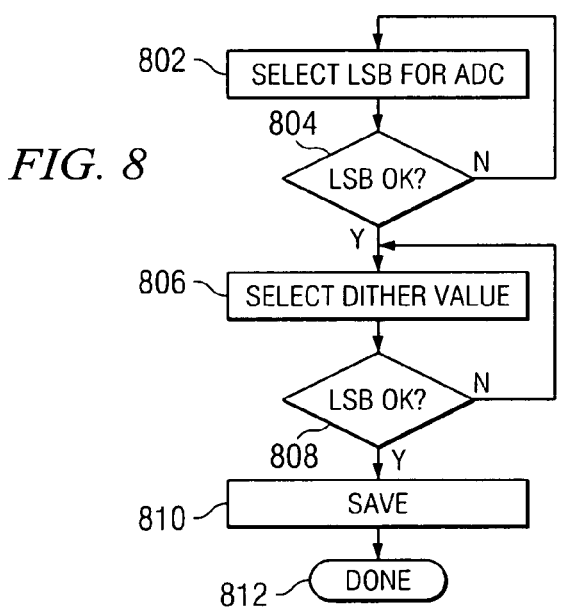
FIG. 8 is a flow diagram illustrating the manner for selecting a LSB resolution for an analog to digital converter and a dither value to minimize limit cycle oscillations.

Referring now to FIG. 8, there is illustrated a flow diagram describing the manner in which the digital control loop may be configured during initial configuration to minimize or eliminate limit cycle oscillations for a particular power supply. Initially at step 802, a resolution for the LSB for the analog to digital converter 110 is selected. A determination is made of the amount of limit cycle oscillations occurring for the selected LSB resolution, and if this amount of limit cycle oscillation is determined at inquiry step 804 to be unacceptable, a different LSB is selected at step 802. Once a desirable LSB resolution has been found at inquiry step 804, the dither value to be applied at the output of the PID 112 may be selected at the step 806. Inquiry step 808 determines if the limit cycle oscillations associated with the selected amount of dither is acceptable, and if not, a next dither value is selected at step 806. Once inquiry step 808 determines that the selected dither value along with the previously selected LSB resolution are acceptable, the process saves the selected dither value and LSB resolution at step 810. The process is completed at step 812.

While the foregoing description has described first setting an LSB resolution of the analog to digital converter 110 and then programming a dither value for insertion into the digital control loop of the switched power supply, it should be realized that these processes could be done in reverse with the dithering value first being established and then setting the LSB resolution of the analog to digital converter. Alternatively, each of these processes could be used individually without use of the other. Thus, limit cycle oscillations could be minimized by only establishing a LSB resolution of the analog to digital converter or the effects of limit cycle oscillations could be minimized by inserting a dither signal without the use of LSB resolution of the analog to digital converter.

Although the preferred embodiment has been described in detail, it should be understood that various changes, substitutions and alterations can be made therein without departing from the scope of the invention as defined by the appended claims.

What is claimed is:

1. A method for minimizing limit cycle oscillations from an output of a switched power supply including a digital control loop having a digital pulse width modulator therein with a digital control input, comprising the steps of:
   combining a digital dither signal with a digital output of a digital proportional integral derivative engine in the digital control loop to provide a combined signal to drive the digital control input of the digital pulse width modulator, the digital dither signal comprising a noise signal; and
   generating an output signal from the switched power supply based upon the combined signal, wherein limit cycle oscillations in the output signal appear as random noise in the output signal due to the digital dither signal.

2. The method of claim 1 further including the step of programmably selecting an amount of the dither signal.

3. The method of claim 1, wherein the step of combining further comprises the steps of:
   providing the dither signal to the output of the proportional integral derivative engine; and
   adding the dither signal to the output of the proportional integral derivative engine.

4. The method of claim 1, wherein the dither signal does not introduce noise at DC into an output of the switched power supply.

5. The method of claim 1, wherein the dither signal causes limit cycle oscillations to appear as random noise within the output rather than as a periodic signal.

6. A method for minimizing limit cycle oscillations from an output of a switched power supply including a digital control loop having a digital pulse width modulator therein, comprising the steps of:
   combining a dither signal with an output of a proportional integral derivative engine in the digital control loop to provide a combined signal;

generating an output signal with minimized limit cycle oscillations from the switched power supply based upon the combined signal; and programmably selecting a resolution of an LSB of a programmable analog to digital converter in the digital control loop, wherein the programmably selected resolution of the LSB is greater than a LSB resolution of the digital pulse width modulator.

7. The method of claim 6, wherein the step of generating further comprises the step of generating the output signal with minimized limit cycle oscillations from the switched power supply based upon the combined signal and the programmably selected LSB resolution of the analog to digital converter.

8. A method for minimizing limit cycle oscillations from an output of a switched power supply including a digital control loop having a digital pulse width modulator therein, comprising the steps of:

programmably selecting a resolution of an LSB of a programmable analog to digital converter in the digital control loop, wherein the programmably selected resolution of the LSB is greater than a LSB resolution of the digital pulse width modulator;

combining a dither signal with the output of a proportional integral derivative engine in the digital control loop to provide a combined signal; and generating the output signal with minimized limit cycle oscillations from the switched power supply based upon the combined signal and the programmably selected LSB resolution of the analog to digital converter.

9. The method of claim 8 further including the step of programmably selecting an amount of the dither signal.

10. The method of claim 8, wherein the step of combining further comprises the steps of:

providing the dither signal to the output of the proportional integral derivative engine; and adding the dither signal to the output of the proportional integral derivative engine.

11. The method of claim 8, wherein the dither signal does not introduce noise into an output of the switched power supply.

12. An apparatus, comprising:

a switched power supply having an input, an output and a control input;

a digital control loop connected between the output and the control input, the digital control loop having an analog input and a digital input; and a digital input to the digital control loop for receiving a digital dither signal, the digital dither signal comprising a noise signal for causing limit cycle oscillations to appear as random noise in an output signal of the switched power supply.

13. The apparatus of claim 12, wherein the dither signal is programmable via an associated controller.

14. The apparatus of claim 12, wherein the dither signal does not introduce noise into an output of the switched power supply.

15. The apparatus of claim 12 wherein the dither signal is independent of the output of the switched power supply.

16. The apparatus of claim 12 wherein the dither signal is continuously combined with the digital output of the digital proportional integral derivative engine.

17. An apparatus, comprising:

a switched power supply having an input, an output and a control input;

a digital control loop connected between the output and the control input; and an input to the digital control loop for a dither signal, the dither signal comprising a noise signal causing limit cycle oscillations to appear as random noise in an output signal of the switched power supply, wherein the digital control loop further comprises:

an analog to digital converter connected to the output of the switched power supply;

a proportional integral derivative engine connected to the analog to digital converter;

an adder circuit connected to an output of the proportional integral derivative engine and the input to the digital control loop for combining the dither signal with the output of the proportional integral derivative engine to provide a combined signal that causes limit cycle oscillations to appear as random noise in the output signal; and a digital pulse width modulator for generating the output signal to control the switched power supply.

18. The apparatus of claim 17, wherein a resolution of an LSB of the analog to digital converter in the digital control loop is programmably selectable.

19. The apparatus of claim 18, wherein the programmably selected resolution of the LSB of the analog to digital converter is greater than an LSB resolution of the digital pulse width modulator.

20. The apparatus of claim 17, wherein the switched power supply generates the output signal with minimized limit cycle oscillations based upon the combined signal and the programmably selected LSB resolution of the analog to digital converter.

21. A digital control loop for a switched power supply, comprising:

an analog to digital converter connected to an output of the switched power supply;

a proportional integral derivative engine connected to the analog to digital converter;

an input to the digital control loop for a dither signal, the dither signal comprising a noise signal for causing limit cycle oscillations to appear as random noise in an output signal of the switched power supply;

an adder circuit connected to an output of the proportional integral derivative engine and to the input to the control loop for combining the dither signal with the output of the proportional integral derivative engine in the digital control loop to provide a combined signal; and a digital pulse width modulator for generating the output signal for controlling the switched power supply based upon the combined signal.

22. The apparatus of claim 21, wherein a resolution of an LSB of the analog to digital converter in the digital control loop is programmably selectable.

23. The apparatus of claim 22, wherein the programmably selected resolution of the LSB is greater than an LSB resolution of the digital pulse width modulator.

24. The apparatus of claim 21, wherein the dither signal is programmable via an associated controller.

25. The apparatus of claim 21, wherein the dither signal causes limit cycle oscillations to appear as random noise within the output rather than as a periodic signal.

* * * * *